United States Patent [19]

Azuma et al.

[11] 4,243,999
[45] Jan. 6, 1981

[54] GATE TURN-OFF THYRISTOR

[75] Inventors: Makoto Azuma, Yokohama; Akio Nakagawa, Hiratsuka, both of Japan

[73] Assignee: Tokyo Shibaura Electric Co., Ltd., Japan

[21] Appl. No.: 58,128

[22] Filed: Jul. 16, 1979

Related U.S. Application Data

[63] Continuation-in-part of Ser. No. 792,398, Apr. 29, 1977, abandoned.

[30] Foreign Application Priority Data

Mar. 8, 1977 [JP] Japan .................................. 52-24489

[51] Int. Cl.$^3$ ............................................. H01L 29/74
[52] U.S. Cl. ...................................... 357/38; 357/36; 357/39; 357/56; 357/90
[58] Field of Search ...................... 357/38, 56, 36, 90, 357/68, 39

[56] References Cited

U.S. PATENT DOCUMENTS 3,609,476  9/1971  Storm .................................... 357/38

OTHER PUBLICATIONS

J. Shimizu et al., "High-Voltage High Power Gate-Assisted Turn-Off Thyristor for High Frequency Use," IEEE Trans. on Elec. Dev., vol. Ed. 23 #8, Aug. 1976, pp. 883-887.

Primary Examiner—Joseph E. Clawson, Jr.
Attorney, Agent, or Firm—Finnegan, Henderson, Farabow, Garrett & Dunner

[57] ABSTRACT

A gate turn-off thyristor which comprises a semiconductor body having at least four contiguous layers, namely, a first layer of a first conductivity type, a second layer lying continguous to the first layer and having a second conductivity type, a third layer lying contiguous to the second layer and having said first conductivity type, and a fourth layer contiguous to the third layer and having said conductivity type;
  an anode electrode mounted on said first layer;
  a gate electrode formed on said third layer; and
  a cathode electrode deposited on said fourth layer, and in which the following two relations are satisfied:

$$\rho \cdot V_j / \rho_{sb} \geq 10.5 (v \cdot cm) \text{ and } \rho_{sb} \leq 35 (\Omega/\square)$$

where $\rho_{sb}$ = sheet resistance ($\Omega/\square$) at the normal temperature of the third layer, $V_j$ = backward withstanding voltage (V) at a PN junction bertween the third and fourth layers, and $\rho$ = specific resistance ($\Omega \cdot cm$) of the second layer.

8 Claims, 29 Drawing Figures

FIG. 1
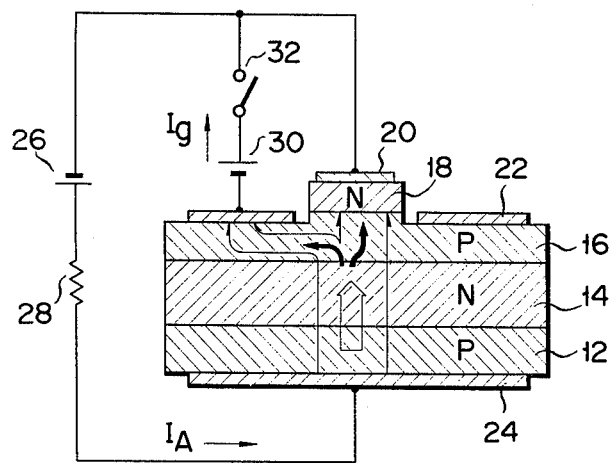
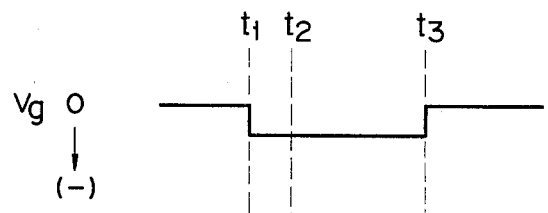
FIG. 2A
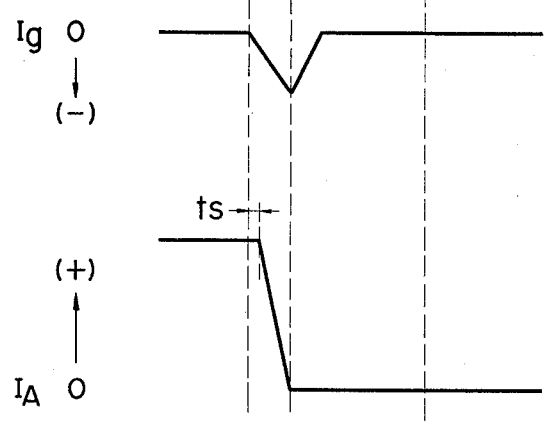
FIG. 2B
FIG. 2C

FIG. 3
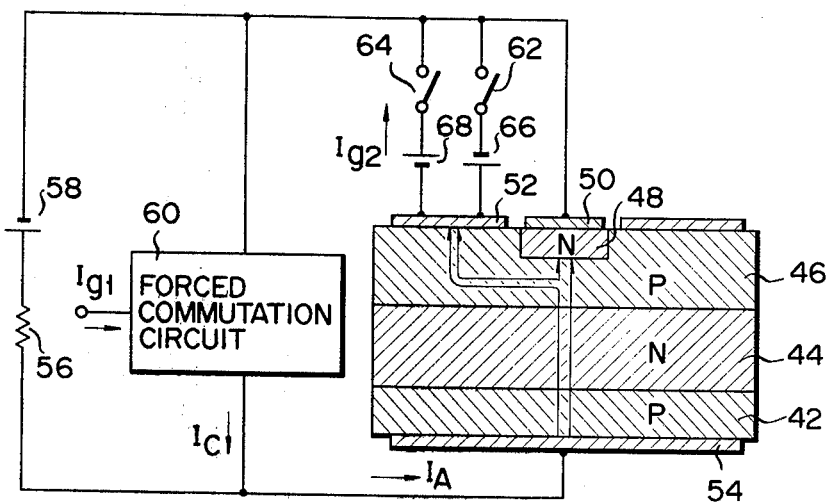
FIG. 4A $I_{g1}$ 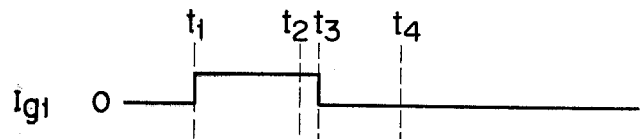
FIG. 4B $I_C$ 
FIG. 4C $I_A$ 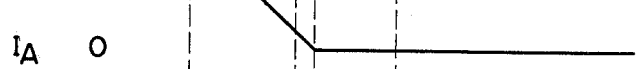
FIG. 4D $I_{g2}$ 

GATE TURN-OFF THYRISTOR

CROSS-REFERENCE TO RELATED APPLICATION

This application is a continuation-in-part of our copending Ser. No. 792,398 now abandoned, filed Apr. 29, 1977, now abandoned and assigned to the same assignee as the parent application.

BACKGROUND OF THE INVENTION

This invention relates to a gate turnoff thyristor which is rendered non-conductive in response to a negative gate signal applied thereto.

A rapid and remarkable technical developement has progressed in semiconductor high-power switching devices, particularly in power thyristors. As is known, the power thyristor cannot be turned off by a gate signal and the turn-off of the power thyristor needs an additional forced commutation circuit, making it difficult to apply the power thyristor to a chopper and the like.

Another high-power switching element, which has been known, is a power transistor which can be turned off by a negative base bias applied thereto. The power transistor is defective in that a continuous flow of the forward base current is needed in order to keep the power thyristor conductive, and that the current capacity of the power transistor is less than that of the power thyristor.

Also, a gate turn-off (GTO) thyristor has been known as a high power switching element, adaptable for switching devices such as inverters, choppers and the like, without the forced commutation circuit. Because of no need of the bulky forced commutation circuit, the GTO thyristor has attracted an attention in the field of high power electronics. However, the GTO thyristor has a drawback; it has an extremely small anode current capacity. This arises from generation of heat due to anode current being locally concentrated when the thyristor is rendered nonconductive. To describe in greater detail, when the thyristor is turned off, anode current flow concentrates through a local portion of the thyristor with the resultant prominent increase in current density at the local portion. Generation of heat there sometimes leads to the damage of the thyristor. For this reason, anode current which can be allowed to pass through the thyristor is subjected to a certain limitation, for example, about 50 to 200 amperes. This small value is about one-tenth of that which is possible with a thyristor in general use.

Among the factors to determine the anode current capacity, i.e. the maximum anode current, the most important factor is a sheet resistance $\rho_{sb}(\Omega/\square)$ of a base layer adjacent to a cathode layer. The reason for this follows. Reference is made to FIG. 1 illustrating in structural and schematic form, a GTO thyristor with a turn-off circuit. As shown, the GTO thyristor has a semiconductor body having four layers, a P anode layer 12, an N base layer 14, a P base layer 16 and a cathode layer 18. These four layers are provided with cathode, gate and electrodes 20, 22 and 24, respectively. The cathode and the anode electrodes 20 and 24 have a series circuit connected therebetween having a power source 26 and a resistor 28. The cathode and the gate electrodes 20 and 22 have a bias power source 30 connected therebetween via a switch 32. In turning off the thyristor thus constructed and connected, a switch 32 is turned on at time $t_1$ in FIG. 2 thereby to bias the gate of the thyristor to a negative potential. That is, a negative pulse (turn-off pulse) Vg as shown in FIG. 2A is applied to the gate electrode 22. Upon receipt of the negative pulse Vg, a gate current Ig as shown in FIG. 2B flows through the P base layer 16. The gate current Ig is obtained by shunting the anode current $I_A$ to some extent but is relatively large in actuality. For example, when the anode current $I_A$ is approximately 400 (A), the gate current Ig ranges from 100 to 200 (A). As the gate current Ig starts to flow, the anode current $I_A$ substantially linearly decreases after lapse of a predetermined time (storage time $t_s$) and becomes zero at time t2, as shown in FIG. 2C. Thereafter, even if the turn-off pulse Vg becomes zero at time t3, the anode current $I_A$ is kept zero. In this manner, the GTO thyristor is turned off. The maximum allowable gate current Ig of the P base layer 16 substantially determines the maximum value of the anode current $I_A$. Accordingly, it is eagerly desired to improve the maximum allowable value of the gate current Ig in order to increase the allowable anode current $I_A$. The maximum value of the gate current Ig to flow into the P base layer 16 is substantially determined by the sheet resistance $\rho_{sb}(\Omega/\square)$ of the P base layer 16.

Thus, the sheet resistance $\rho_{sb}(\Omega/\square)$ of the P base layer 16 is an important factor to determine the maximum allowable gate current Ig, that is to say, the maximum anode current $I_A$.

In contrast with the general type GTO thyristor as shown in FIG. 1, a special type GTO thyristor is known called a gate-assisted turn-off thyristor (GATT). However, the sheet resistance $\rho_{sb}(\Omega/\square)$ of the anode current capacity of the GATT is less important than that of the general type GTO. In more particular, the GATT is comprised of a P anode layer 42, an N anode layer 44, a P base layer 46 and an N cathode layer 48, as shown in FIG. 3. The layers 48, 46 and 42 are connected to cathode, gate and anode electrodes 50, 52 and 54, respectively. A power source 58 connected in series with a resistor 56 is connected between the cathode and anode electrodes 50 and 54 and a forced commutation circuit 60 is also connected between these electrodes 50 and 54. A couple of series circuits, which include a switch 62 and a positive bias power source 66, and a switch 64 and a negative bias power source 68, is inserted between the gate and cathode electrodes 52 and 50.

In turning off the GATT thus constructed, a gate pulse current Ig1 is fed to the thyristor (not shown) of the forced commutation circuit at time t1, as shown in FIG. 4A. Upon receipt of the gate pulse, the thyristor is turned on to cause a current $I_A$ flowing the anode to cathode path of the thyristor through the resistor 56 to shunt as a current Ic (FIG. 4B) into the commutation circuit 60. Accordingly, the anode current $I_A$ substantially linearly decreases with time. On the other hand, the shunt current Ic increases with time. When the anode current $I_A$ becomes substantially zero, i.e. at time t2, the switch 64 is turned on. Accordingly, the gate electrode 52 is biased negatively, so that the anode current $I_A$ becomes approximately zero flow through the P base layer 46 to the gate electrode 52. The gate current at this time is denoted as Ig2 in FIG. 4D. At time t3, when the anode current $I_A$ approximates zero, the gate current Ig1 flowing into the commutation circuit 60 is shut off. The shunt current Ic is maximized shortly after the anode current $I_A$ is zeroed and then linearly decreases with time. If the pulse Ig2 disappears at time t4, no anode current $I_A$ flows. In this way, the GATT is turned off.

The current Ig2 flows into the P base layer 46 when the anode current $I_A$ becomes substantially zero. Therefore, it is very small and is much smaller than the current flowing into the P base layer 16 (FIG. 5) in the case of the GTO thyristor.

Therefore, in the case of the GATT, the sheet resistance $\rho_{sb}(\Omega/\square)$ of the P base layer 46 is not an important factor to determine the anode current $I_A$. To repeat, the sheet resistance of the P base layer is a very important factor to determine the anode current in the case of the GTO thyristor but is not in the case of the GATT. That is, the sheet resistance $\rho_{sb}(\Omega/\square)$ of the P base layer 46 is a very important factor when the anode current especially in the GTO is taken into consideration.

SUMMARY OF THE INVENTION

Accordingly, an object of the invention is to provide a GTO of which the anode current capacity is improved by taking account of a major factor to determine the sheet resistance of the base layer adjacent the cathode layer and other some factors.

According to the invention, there is provided a gate turn-off thyristor comprising a semiconductor body having at least four contiguous layers, namely, a first layer of a first conductivity type, a second layer lying contiguous to the first layer and having a second conductivity type, a third layer lying contiguous to the second layer and having the first conductivity type, and a fourth layer lying contiguous to the third layer and having the second conductivity type; an anode electrode mounted on the first layer; a gate electrode formed on the third layer; and a cathode electrode deposited on the fourth layer, and in which the following two equations are satisfied:

$$\rho \cdot V_j/\rho_{sb} \geq 10.5 \ (v \cdot cm) \text{ and } \rho_{sb} \leq 35 \ (\Omega/\square)$$

where $\rho_{sb}$=sheet resistance $(\Omega/\square)$ at the normal temperature of the third layer, $V_j$=backward withstanding voltage (V) at a PN junction between the third and fourth layers and $\rho$=specific resistance $(\Omega \cdot cm)$ of the second layer.

BRIEF DESCRIPTION OF THE DRAWINGS

FIG. 1 shows a conventional GTO thyristor with a turn-off circuit;

FIGS. 2A to 2C show a set of waveforms useful in explaining the operation of the turn-off operation of the GTO thyristor;

FIG. 3 shows a cross sectional view of a conventional GATT with a turn-off circuit;

FIGS. 4A to 4D show a set of timing diagrams useful in explaining the turn-off operation of the GATT shown in FIG. 3;

DETAILED DESCRIPTION OF THE PREFERRED EMBODIMENTS

Figure 5:
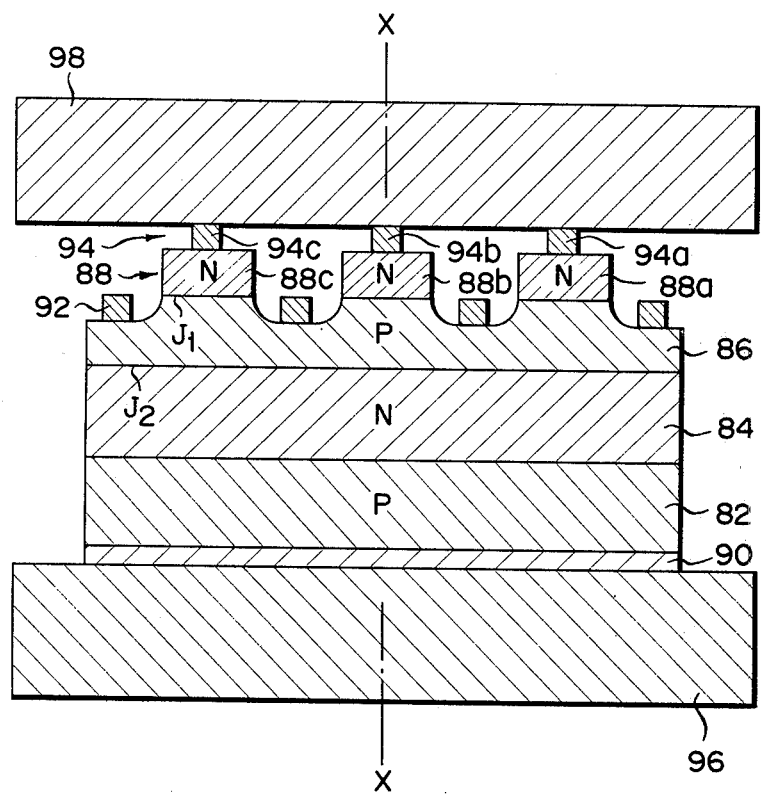
FIG. 5 is a cross sectional view of a GTO thyristor according to the invention.

Referring to FIG. 5, a GTO thyristor according to one embodiment of this invention comprises a semiconductor body formed of four PNPN layers denoted by referential numerals 82, 84, 86, 88 respectively; electrodes 90, 92, 94 mounted on the P layer 82, P layer 86 and N layer 88 respectively; and a pair of package electrodes 96, 98 enclosing the whole of the above-mentioned assembly.

With the GTO thyristor arranged as described above, the P layer 82, N layer 84, P layer 86 and N layer 88 are used as an anode layer, first base layer, second base layer and cathode layer, respectively. The electrodes 90, 92, 94 act so an anode electrode, gate electrode and cathode electrode, respectively. The cathode layer 88 is divided into several portions 88a, 88b 88c ... The cathode electrode 94 is also divided into several portions 94a, 94b, 94c ... corresponding to the divided cathode layer portions 88a, 88b, 88c ...

Figure 6:
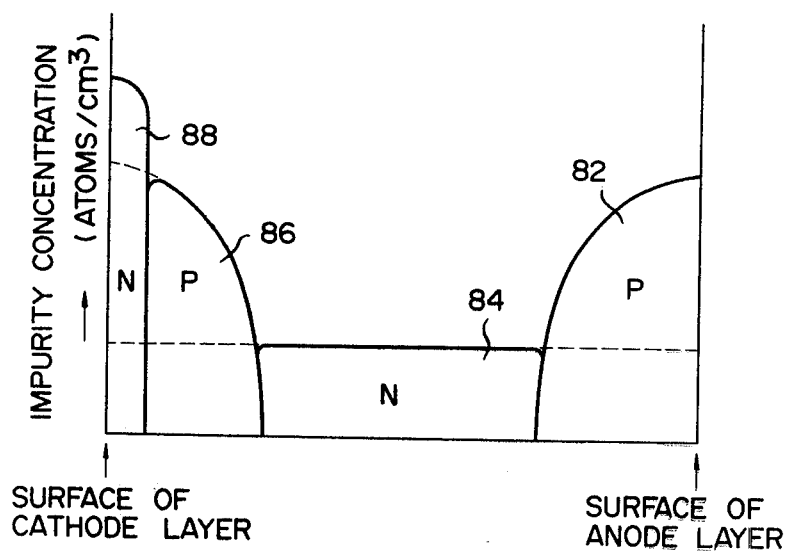
FIG. 6 shows the concentration of impurities diffused in the four semiconductor layers of the GTO thyristor in FIG. 5.

Impurities are diffused in the four PNPN layers 82, 84, 86, 88 with concentration distribution indicated in FIG. 6.

The turnoff operation of the GTO thyristor of FIG. 5 is theoretically attained when excessive carriers are expelled from the P base layer 86 by supplying the gate electrode 92 with negative gate signal. Namely, where a negative voltage signal is conducted to the gate electrode 92, then holes constituting the excessive carriers in the P base layer 86 are discharged outside of the GTO thyristor through the gate electrode 92. At this time, electrons are also expelled from the cathode electrode 94 through the PN junction $J_1$ between the cathode layer 88 and P base layer 86. Accordingly, negative current runs through the gate electrode 92, thus giving rise to substantially the same condition as when a voltage $V_{gk}$ is impressed across the cathode electrode 94 and gate electrode 92. This voltage $V_{gk}$ is so impressed as to attain the backward biasing of the PN junction between the cathode layer 88 and P base layer 86. Therefore, as the turnoff process proceeds a potential difference occurring in the backward direction of the PN junction $J_1$ becomes more prominent. As the result, electrons are transferred from the cathode layer 88 to the P base layer 86 in smaller amounts. Further, excessive carriers in the P base layer 86 are decreased, because they are expelled through the gate electrode 92 and also recombined with electrons. A potential difference occurring in the backward direction of the PN junction $J_1$ between the P base layer 86 and cathode layer 88 is maintained, until excessive carriers or electrons in the N base layer 84 disappear by being recombined with holes, thereby rendering the GTO thyristor nonconductive.

Figure 7:
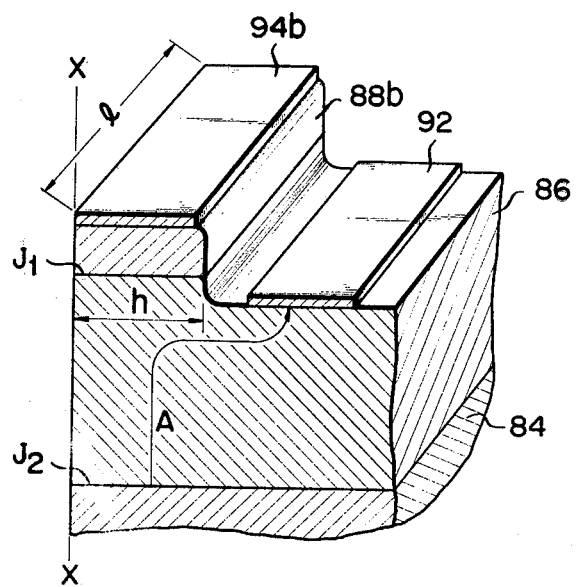
FIG. 7 shows a fractional oblique view of the right portion of FIG. 5 extending from line x—x.

A level of the backward bias voltage of the PN junction $J_1$ is determined by the backward withstand voltage $V_{J1}$ of said PN junction $J_1$. To keep the PN junction $J_1$ backward-biased, it is preferred to raise the backward withstand voltage of the PN junction $J_1$. The reason is that a gate current $I_g$ is eventually formed of a drift current alone at the last stage of the turnoff process. Excessive carriers in the P base layer 86 are expelled through the gate electrode 92 along a route indicated by the character A in FIG. 7. FIG. 7 is a fractional oblique view of the right side portion of the GTO thyristor of FIG. 5 extending from line X—X. The line X—X is drawn along the longitudinal central line of the cathode layer portion 88b. The lower the lateral resistance $R_b$ of the P base layer 86, the more effective the discharge of excessive carriers from said P base layer 86. Therefore, the larger the ratio of $V_{J1}/R_b$, the easier the turnoff of the GTO thyristor. The ratio $V_{J1}/R_b$ which represents a gate current $I_g$ in the turnoff process may be expressed by the following equation:

$$I_g = V_{J1}/R_b \tag{1}$$

The lateral resistance $R_b$ may be expressed as follows:

$$R_b = \rho_{sb} \cdot h/l$$

where:

$\rho_{sb}$ = sheet resistance ($\Omega/\square$) of the P base layer 86 h = half the crosswise length of the PN junction $J_1$ between the cathode layer 88 and P base layer 86 l = longitudinal length of the PN junction $J_1$ though, with the foregoing embodiment, a GTO thyristor takes the rectangular form, yet this invention need not be limited thereto.

The sheet resistance $\rho_{sb}$ of the P base layer 86 may be expressed as follows:

$$\rho_{sb} = 1/q \int_{J_1}^{J_2} \mu N_b dx \tag{2}$$

where:

$J_2$ = position of a PN junction between the N base layer 84 and P base layer 86

$N_b$ = concentration of an impurity diffused in the P base layer 86

$\mu$ = mobility of electrons or holes in the P base layer 86 q = electric charge of electrons or holes The following equation results from the above description:

$$I_g = K \cdot V_{J1}/\rho_{sb} \cdot h \tag{3}$$

where:

K = proper constant of the respective GTO thyristor units when an anode current is locally concentrated. This constant has a dimension of length.

Anode current $I_A$ running through the individual GTO thyristor units may be expressed as follows, using a gain $G_{off}$ at the turnoff and gate current $I_g$:

$$I_A = G_{off} \times I_g \tag{4}$$

A total anode current $I_{AT}$ flowing through the whole GTO thyristor formed of a plurality of GTO thyristor units may be expressed as follows:

$$I_{AT} = K \cdot n \cdot G_{off} \cdot V_{J1}/\rho_{sb} \cdot h \tag{5}$$

where:

n = a constant by which a balance can be established between the individual GTO thyristor units at the time of turnoff.

Where a load connected to a GTO thyristor is chosen to have a prescribed resistance value, then the term $K \cdot n \cdot G_{off}$ of the equation (5) constitutes a function of a specific resistance $\rho$ at the normal temperature of the N base layer 84.

The smaller the value of h given in the equation (5), the larger the total anode current $I_{AT}$. If, however, h is let to have a certain value which is smaller than the diffusion length of holes in the P base layer 86, little change occurs in the effect of expelling holes from the P base layer 86 through the gate electrode 92. Namely, a minimum effective value of h may be taken as a constant substantially representing the diffusion length of holes, for example 160 $\mu$m.

It is seen from the foregoing discussion that factors of defining the anode current capacity a GTO thyristor are $V_{J1}/\rho_{sb}$ and the specific resistance $\rho$ at the normal temperature of the N base layer 84.

Figure 8:
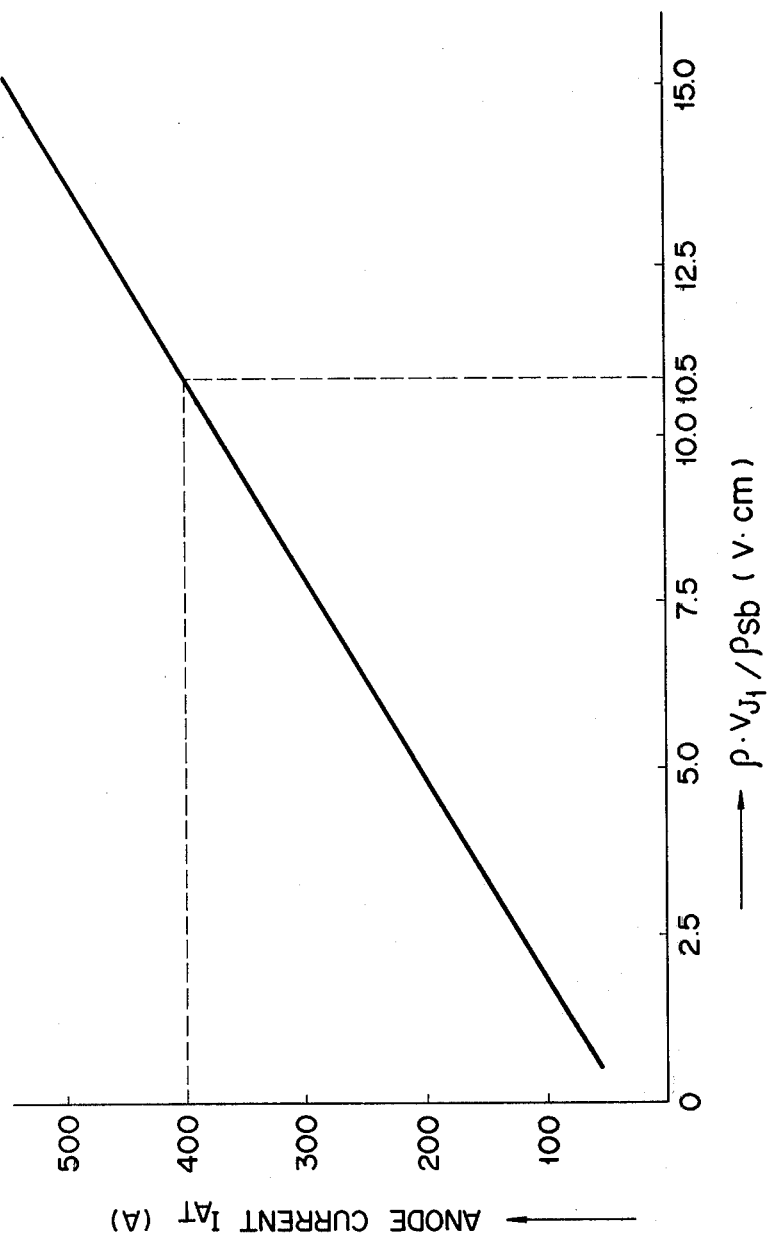
FIG. 8 shows a coordinate system showing the relationship between a total anode current $I_{AT}$ and $V_{J1}/\rho_{sb}$.

FIG. 8 shows the relationship between $V_{J1}/\rho_{sb}$ and the total anode current $I_{AT}$ of the GTO thyristor where a resistor having a resistance of 0.5 ($\Omega$) is connected as a load.

Figure 9:
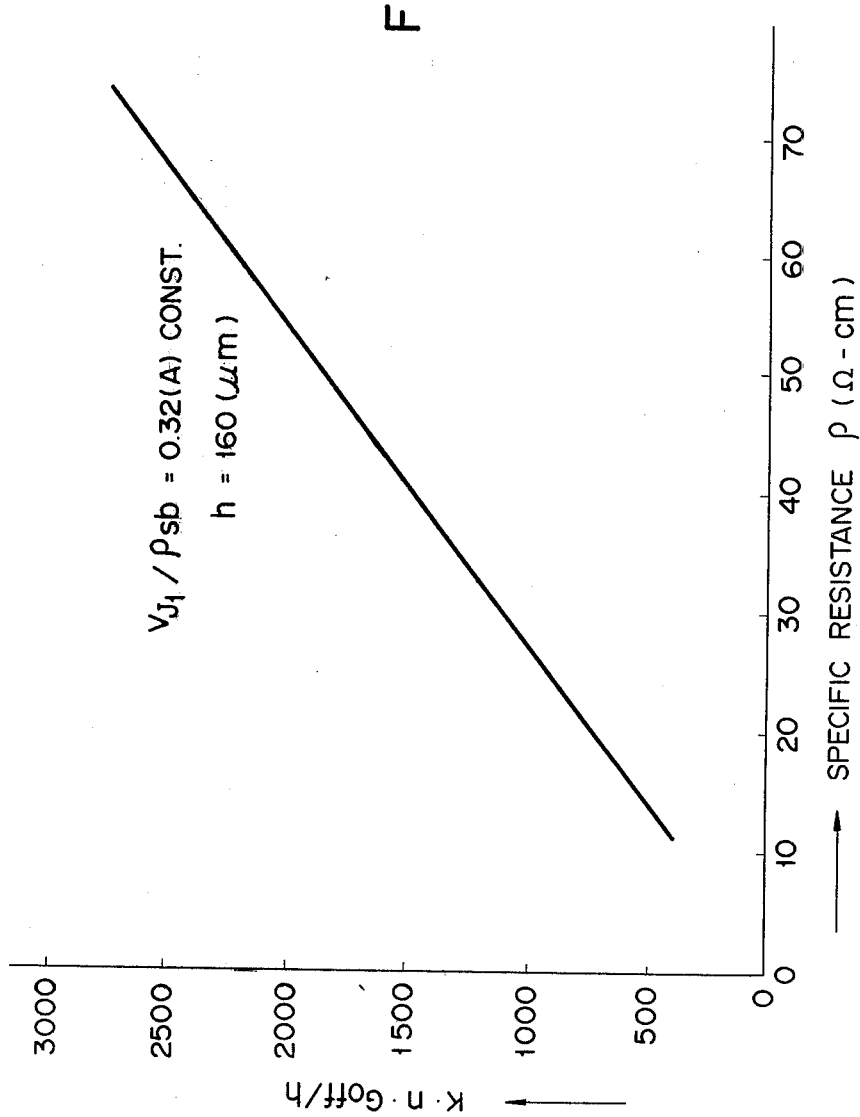
FIG. 9 is a coordinate system indicating the relationship between a specific resistance $\rho$ and $K \cdot m \cdot G_{off}/h$.

FIG. 9 sets forth the relationship between $K \cdot n \cdot G_{off}/h$ and changes in the specific resistance $\rho$ at the normal temperature of the N base layer 84, where a resistor having a resistance of 0.5 ($\Omega$) is connected as a load, and $V_{J1}/\rho_{sb}$ is taken to have a constant value.

As apparent from FIG. 9, the larger the specific resistance $\rho$ at the normal temperature of the N base layer 84, the more increased the value of $K \cdot n \cdot G_{off}/h$. The reason is assumed to be that where the moving of carriers, namely, the flow of current takes place in a smaller amount at the PN junction $J_2$ between the N base layer 84 and the P base layer 86, then a depletion layer formed in the PN junction $J_2$ is progressively widened as the N base layer 84 has a higher specific resistance $\rho$ at the normal temperature, and that since an electric field becomes smaller at the PN junction $J_2$, a balance can be more easily established between the current running through the individual GTO thyristor units. It is seen from the foregoing description that $V_{J1}/\rho_{sb}$ and the specific resistance $\rho$ at the normal temperature of the N base layer 84 determine the total anode current $I_{AT}$ of a GTO thyristor. The total anode current $I_{AT}$ of the GTO thyristor may be expressed by the following equation by reference to FIGS. 8 and 9:

$$I_{AT} = 38 \cdot \rho \cdot V_{J1}/\rho_{sb} \tag{6}$$

In case of $\rho \cdot V_{J1}/\rho_{sb} = 10.5$, the total anode current $I_{AT}$ is calculated to be 400 amperes from the above equation (6).

When measurement was made of various factors of a GTO thyristor designed to have a total current capacity of 400 amperes on the basis of $\rho \cdot V_{J1}/\rho_{sb} = 10.5$, the following results were obtained:

Impurity concentration in the N base layer $84 = 2 \times 10^{14}$ (atoms/cm$^3$)

Surface concentration $N_b$ of impurity in the P base layer $86 = 2 \times 10^{18}$ (atoms/cm$^3$)

Surface concentration of impurity in the cathode layer $88 = 5 \times 10^{20}$ (atoms/cm$^3$)

Thickness of the cathode layer $88 = 10$ ($\mu$m)

Thickness of the P base layer $86 = 53$ ($\mu$m)

Withstand voltage in the backward direction of the PN junction $J_1$ between the cathode layer 88 and P base layer $86 = 10$ (volts)

Half the crosswise length of the PN junction $J_1$ between the cathode layer 88 and P base layer $86 = 160$ ($\mu$m)

When measurement was made of the prior art GTO thyristor, the following result was obtained:

$$V_{J1}/\rho_{sb} \leq 10.5 \text{ (v·cm)}$$

As previously mentioned, a withstand voltage in the backward direction of the PN junction $J_1$ between the P base layer 86 and cathode layer 88 is preferred to be as high as possible. This withstand voltages is progressively elevated, as impurities are diffused at lower concentrations in those portions of the P base layer 86 and cathode layer 88 which lie near the PN junction $J_1$. The P base layer 86 and cathode layer 88 are generally formed by diffusing impurities. An impurity is usually diffused at a higher concnetration in the proximity of that surface of the respective layers 86, 88 in which the diffusion takes place.

With a mesa type GTO thyristor, the PN junction $J_1$ between the P base layer 86 and cathode layer 88 is formed apart from the surface of the thyristor element and, moreover, in the horizontal direction of said thyristor element in which impurities are diffused at a uniform concentration, thereby providing a high backward withstand voltage.

Figure 10:
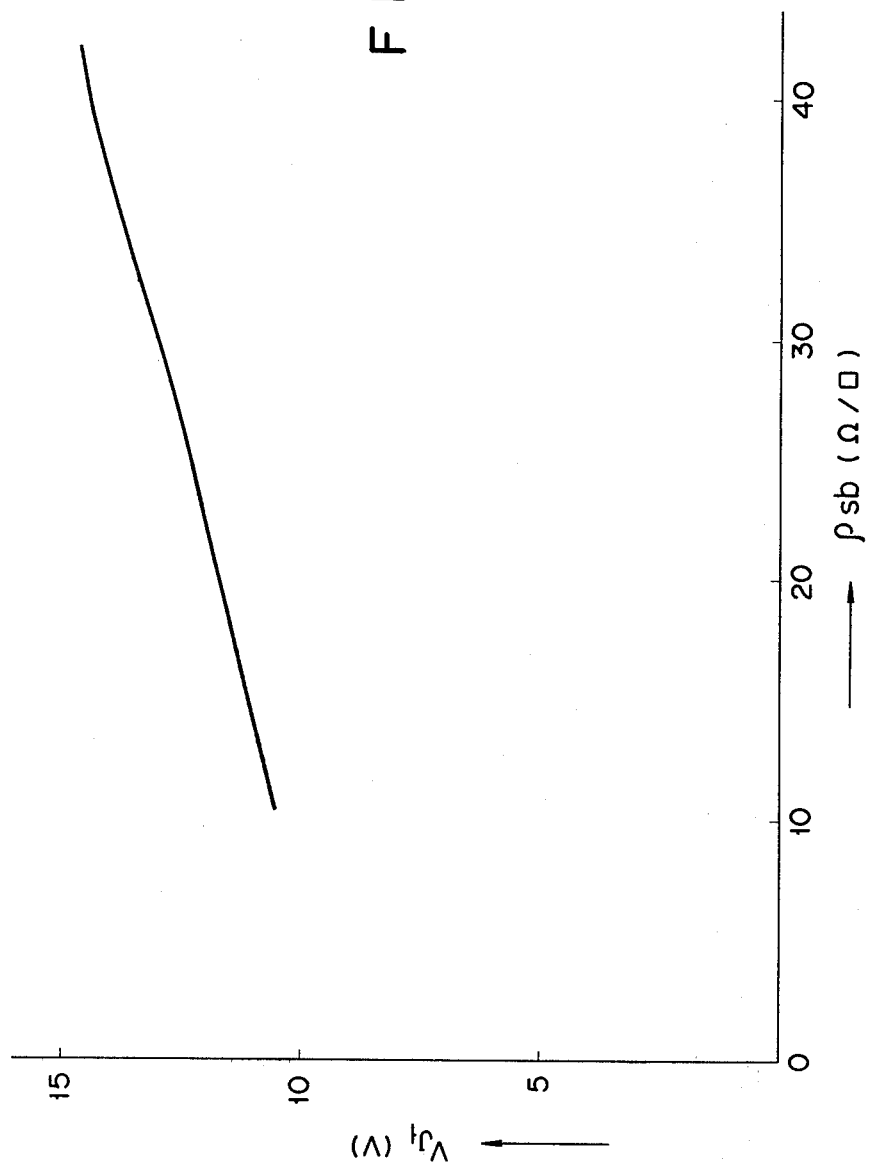
FIG. 10 is a coordinate system indicating the relationship between a backward withstanding voltage $V_{j1}$ and a sheet resistance $\rho_{sb}$.

An investigation was made of a relationship between the sheet resistance $\rho_{sb}$ ($\Omega/\square$) and the backward withstanding voltage $V_{j1}$ (V). In FIG. 10, there is plotted a variation of the backward withstanding voltage $V_{j1}$(V) with respect to the sheet resistance $\rho_{sb}$ ($\Omega/\square$), using a plurality of GTO's each having 400 A or more of anode current capacity. As seen, the backward withstanding voltage $V_{j1}$ increases as the sheet resistance $\rho_{sb}$ increases but a rate of an increase of the backward withstanding voltage is small. For example, when the sheet resistance is increased from about 10 ($\Omega/\square$) to 40 ($\Omega/\square$), the corresponding change of the backward withstanding voltage $V_{j1}$ is only 5 V, i.e. from about 10 V to 15 V. It will be understood that the relatively large changes in sheet resistance with respect to a change of the impurity concentration of the P base layer 86 results in little change in the backward withstanding voltage $V_{j1}$ with respect to the same. This fact is also disclosed in "Physics and Technology of Semiconductor Devices" by A. S. Grove, page 196, FIGS. 6 and 29, published 1967.

Figure 11:
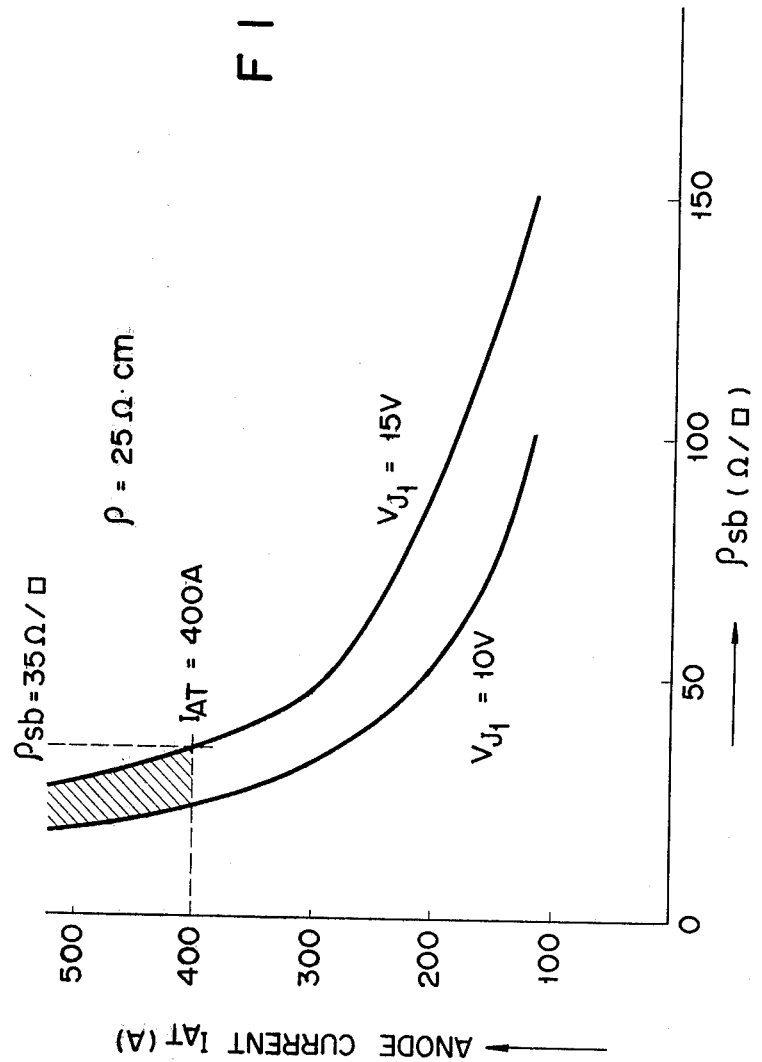
FIG. 11 is a coordinate system indicating the relationship between a total anode current $I_{AT}$ and a sheet resistance $\rho_{sb}$.

As described above, relatively large changes of the sheet resistance $\rho_{sb}$ ($\Omega/\square$) compared to the backward withstanding voltage $V_{j1}$ is an important factor. Therefore, it is a significant matter to investigate a relationship between the anode current $I_{AT}$(A) and the sheet resistance $\rho_{sb}$ ($\Omega/\square$). In FIG. 11 illustrating the result of the investigation, an X-coordinate axis represents a sheet resistance $\rho_{sb}$ ($\Omega/\square$) and a Y-coordinate axis represents an anode current $I_{AT}$(A). A curve I is plotted when the backward withstanding voltage $V_{j1}$ (V) is 10 V, and a curve II plotted when $V_{j1}$ is 15 V. The specific resistance $\rho$ of the N base layer 84 is 25 ($\Omega$-cm) for both cases. As seen from FIG. 11, change of the anode current $I_{AT}$ is relatively small within a relatively great range of the specific sheet resistance but greater changes occur below 50 ($\Omega/\square$) of the sheet resistance. Also, it is seen that 35 ($\Omega/\square$) is necessary in order to obtain 400 (A) or more of the anode current $I_{AT}$.

From the above-mentioned facts, it is concluded that the flow of the total current $I_{AT}$ of 400 (A) or more in the GTO thyristor as shown in FIG. 5 needs $\rho_{sb} \leq 35$ ($\Omega/\square$), in addition to the $\rho \cdot V_{j1}/\rho_{sb} \geq 10.5$ (V.cm).

While the description thus far made relates to a GTO thyristor in which the cathode layer 88 is divided into a plurality of mesa-type cathode layer portions, the invention is not limited to such but is applicable for a GTO thyristor of the planar type.

There will now be described by reference to FIGS. 10A to 10F the sequential steps of manufacturing the GTO thyristor as shown in FIG. 5.

Figure 12A:
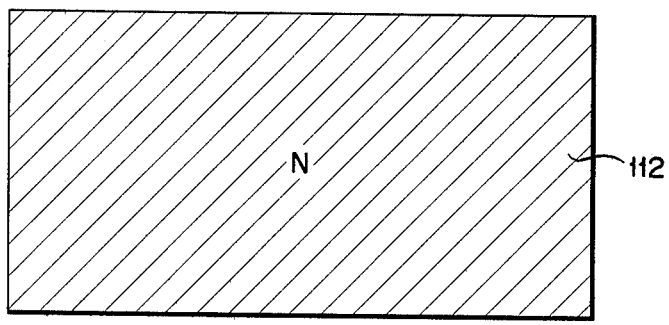
FIGS. 12A to 12F jointly set forth the sequential steps of manufacturing the GTO thyristor of FIG. 5.
Figure 12B:
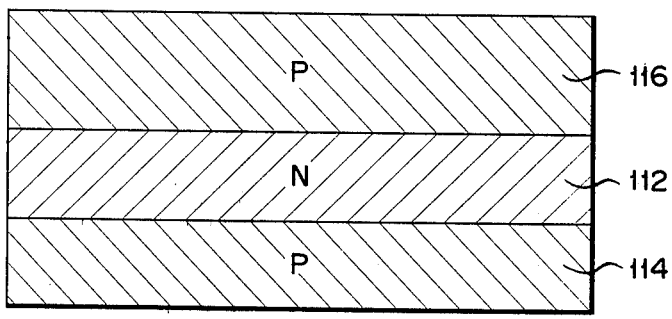
Figure 12C:
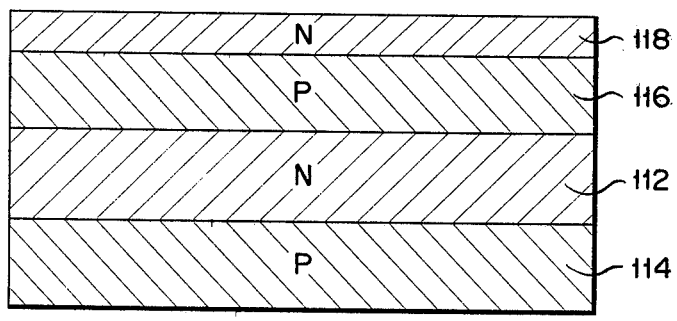
Figure 12D:
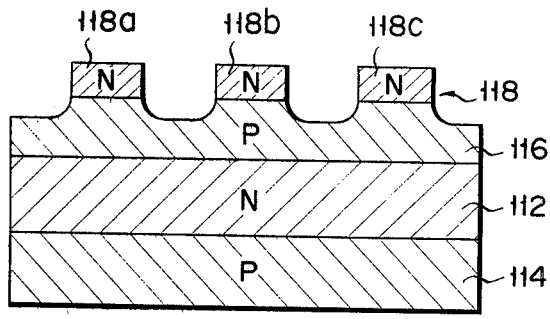
Figure 12E:
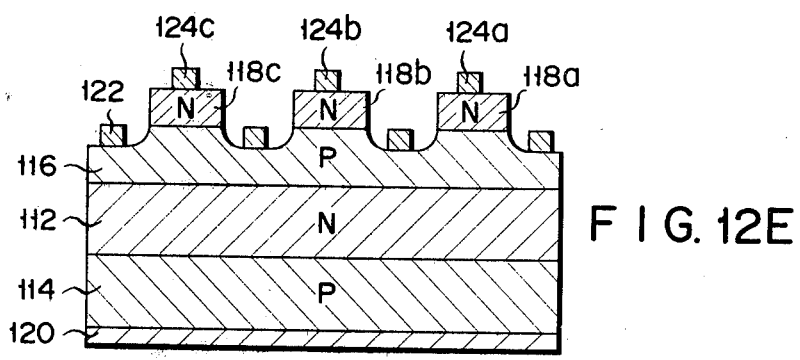
Figure 12F:
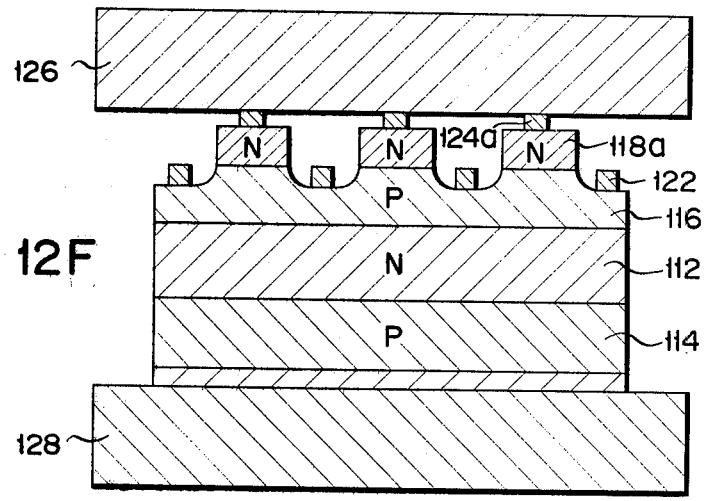

First, a silicon substrate 112 of, for example, an N type, is prepared as shown in FIG. 10A. This substrate 112 has a low impurity concentration as $10^{13}$ to $10^{16}$ atoms/cm$^3$. Boron (B) or gallium (Ga) is diffused from both surfaces of the substrate 112 to provide P layers 114, 116 as illustrated in FIG. 10B. The P layer 114 is used as a cathode layer, and the P layer 116 as a P base layer. The surface impurity concentration of the P layers 114, 116 is of the order of $2 \times 10^{18}$ atoms/cm$^3$. Next, phosphorus (P), for example, is diffused in the P base layer 116 to form on N layer 118, as shown in FIG. 12C. This N layer 118 is used as a cathode layer. The N layer 118 is divided, by using a photo engraving process, into a plurality of portions 118a, 118b, 118c . . . as indicated in FIG. 12D. A semiconductor device including these divided cathode layer portions is a multi-emitter type, which may be considered to be substantially formed of a plurality of parallel arranged GTO thyristor units. Later, an aluminum (Al) layer is deposited on the P layers 114, 116 and divided N layer portions 118a, 118b, 118c . . . to provide electrodes 120, 122, 124a, 124b, 124c . . . as shown in FIG. 12E. The electrode 120 is used as an anode electrode; the electrode 122 as a gate electrode; and the electrodes 124a, 124b, 124c . . . as cathode electrodes. Finally, a pair of package electrodes 126, 128 are pressed against the above-mentioned assembly from the top and bottom, as set forth in FIG. 12F. These sequential steps provide a GTO thyristor embodying this invention.

Figure 13:
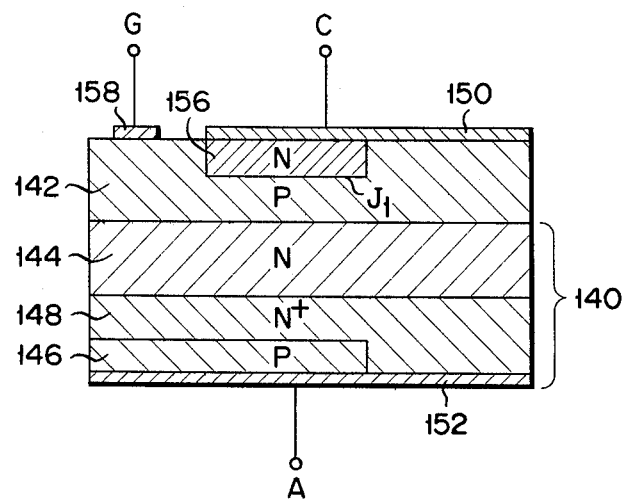
FIG. 13 shows a cross sectional view of a GTO thyristor according to another embodiment of the invention.
Figure 14:
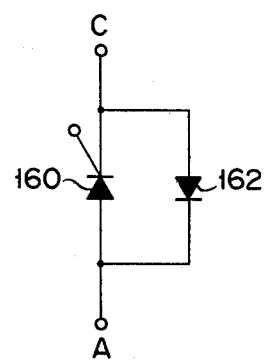
FIG. 14 shows an equivalent circuit diagram of the embodiment of FIG. 13.

Referring to FIG. 7 showing a GTO thyristor according to another embodiment of this invention, the N base layer 140 comprises two regions having different impurity concentrations, that is, a first region 144 having a specific resistance $\rho$ ($\Omega$·cm) and lying contiguous to a P base layer 142; and a second N+ region 148 having a high impurity concentration and lying partly contiguous to a P anode layer 146. The P base layer 142 is coated with a cathode electrode 150. An anode electrode 152 is deposited on the underside of the N+ region 148 and that of the P anode layer 146. Reference numeral 156 denotes cathode layer, and 158 indicates a gate electrode. The characters A, C, G show anode, cathode and gate terminals respectively. The embodiment of FIG. 13 may be represented by the equivalent circuit diagram of FIG. 14. As seen from this equivalent circuit diagram, a GTO thyristor according to the embodiment of FIG. 13 may be regarded as being formed of a thyristor 160 and diode 162 connected in parallel in opposite directions. Thus, the GTO thyristor of FIG. 13 admits of backward introduction of current. Where the sheet resistance $\rho_{sb}$ of the P base layer 142, the backward withstand voltage $V_{j1}$ of the PN junction $J_1$ between the P base layer 142 and cathode layer 156, and the specific resistance $\rho$ at the normal temperature of the N base region 144 are designed to have such a relationship as satisfies the following equations:

$$\rho \cdot V_{j1}/\rho_{sb} \geq 10.5 \ (v \cdot cm), \quad \rho_{sb} \leq 35 \ (\Omega/\square)$$

then the GTO thyristor of FIG. 13 can preserve a larger anode current capacity than 400 amperes.

Figure 15:
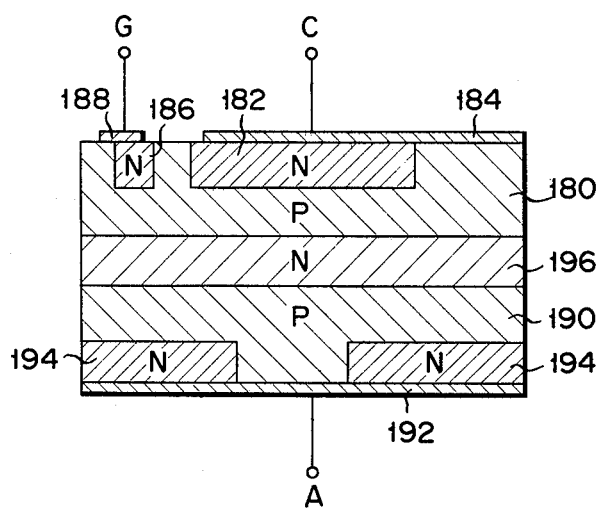
FIG. 15 shows a cross sectional view of a GTO thyristor according to still another embodiment of the invention.

Referring to FIG. 15 presenting a GTO thyristor according to still another embodiment of this invention, a P base layer 180 is made flush with a cathode layer 182. A cathode electrode 184 is deposited on part of the surface of the P base layer 180 and substantially the whole of the surface of the cathode layer 182. An N layer 186 is formed on that part of the surface of the P base layer 180 which is not coated with the cathode electrode 184. A gate electrode 188 is mounted on the N layer 186 and a part of the P base layer 180. An N layer 194 is formed in an anode layer 190 in contact with an anode electrode 192. Reference numeral 196 denotes an N base layer, and the characters A, C, G show anode, cathode and gate terminals respectively.

Figure 16:
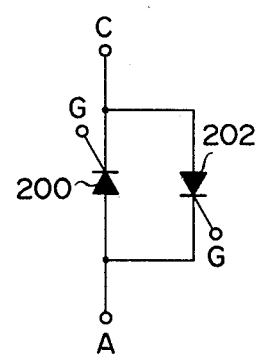
FIG. 16 shows an equivalent circuit diagram of the embodiment of FIG. 15.

The GTO thyristor of FIG. 15 may be represented by the equivalent circuit diagram of FIG. 16, in which two thyristors 200, 202 are connected in parallel in opposite directions, thereby controlling the passage of current in both ways by a gate signal. Where the sheet resistance $\rho_{sb}$ of the P base layer 180, the backward withstand voltage $V_{J1}$ of the PN junction $J_1$ between the P base layer 180 and cathode layer 182, and the specific resistance $\rho$ at the normal temperature of the N base layer 196 are chosen to have such a relationship as satisfied the follow equation:

$$\rho \cdot V_{J1}/\rho_{sb} \geq 10.5 \ (v \cdot cm), \quad \rho_{sb} \leq 35 \ (\Omega/\square)$$

then the GTO thyristor of FIG. 15 can be provided with a larger current capacity than 400 amperes as in the embodiments of FIGS. 5 and 13.

Figure 17:
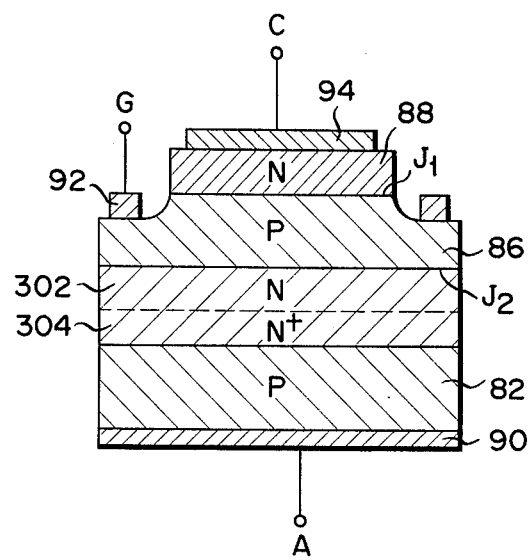
FIG. 17 shows a GTO thyristor according to a further embodiment of the invention.

A GTO thyristor according to a further embodiment of this invention indicated in FIG. 17 has substantially the same arrangement as that of FIG. 5, excepting that an N base layer is formed of two regions having different impurity concentrations. The same parts of FIG. 17 as those of FIG. 5 are denoted by the same numerals, description being given only of those parts which are different from those of FIG. 5.

Figure 18:
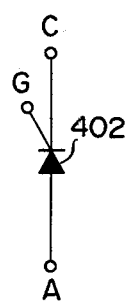
FIG. 18 shows an equivalent circuit diagram of the embodiment of FIG. 17.
Figure 19:
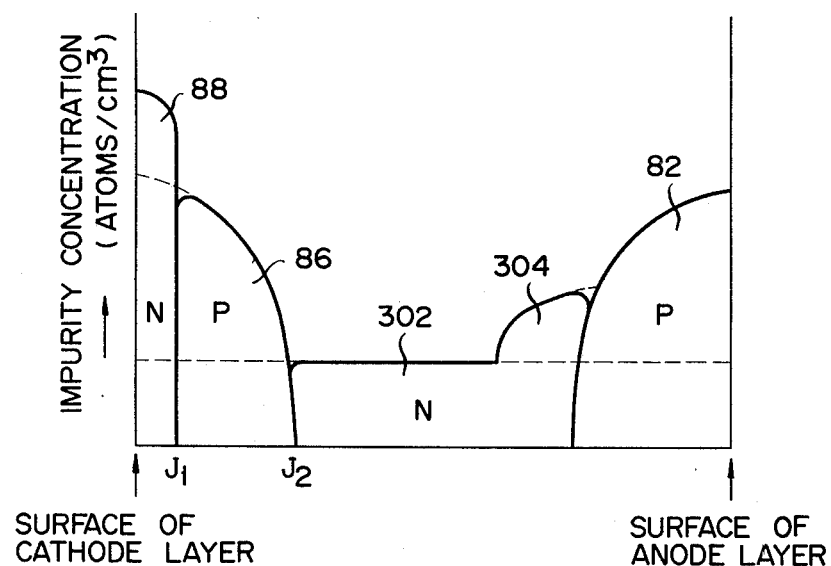
FIG. 19 shows the impurity concentrations in the respective semiconductor layers of the embodiment of FIG. 7.

With the GTO thyristor according to the embodiment of FIG. 17, the N base layer is formed of an N region 302 contiguous to the P base layer 86 and an N+ region 304 having a high impurity concentration and lying contiguous to the anode layer 82. The characters A, C, G denote an anode terminal, cathode terminal and gate terminal respectively. The GTO thyristor of FIG. 17 may be represented by the equivalent circuit diagram of FIG. 18. FIG. 19 shows the distribution of impurity concentrations in the respective layers. Provision of the N+ region 304 as in the embodiment of FIG. 17 presents not only the effect described with respect to the embodiment of FIG. 5, but also the effect of reducing the thickness of the N region 302. Further, a total thickness of the N region 302 and N+ region 304 put together can be decreased more than the thickness of the N layer 84 of FIG. 5. This is for the following reason. A depletion layer is present in the PN junction $J_2$ between the P base layer 86 and N base region 302. This depletion layer is progressively widened, as a backward bias voltage impressed on the PN junction $J_2$ is elevated. Where a backward bias voltage applied exceeds a certain value, then a phenomenon of punchthrough arises. Where the N+ region 304 is omitted to avoid this event, then the P base layer 86 should be made thicker than a certain value. Where, however, the N+ region 304 is provided as in the embodiment of FIG. 17, then the depletion layer in the PN junction $J_2$ is prevented by said N+ region 304 from being widened, thereby suppressing the occurrence of the above-mentioned punch-through and consequently enabling the N region 302 to be made appreciably thin. Further, provision of the N+ region 304 can reduce the appearance of leakage current at the PN junction $J_2$.

Even where the conductivity type in the embodiments of FIGS. 5, 13, 15 and 17 is reversed, this invention can obviously be applied.

What we claim is:

1. A gate turnoff thyristor which comprises a semiconductor body having at least four contiguous layers, namely, a first diffused layer of a first conductivity type, second layer lying contiguous to the first layer and having a second conductivity type, a third diffused layer lying contiguous to the second layer and having said first conductivity type, and a fourth diffused layer lying contiguous to the third layer and having said second conductivity type;

an anode electrode mounted on said first layer;
a gate electrode formed on said third layer; and
a cathode electrode deposited on said fourth layer, and in which the following two equations are satisfied:

$$\rho \cdot V_j/\rho_{sb} \geq 10.5 (v \cdot cm) \text{ and } \rho_{sb} \leq 35 (\Omega/\square)$$

where:
$\rho_{sb}$=sheet resistance ($\Omega/\square$) at the normal temperature of the third layer
$V_j$=backward withstanding voltage (V) at a PN junction between the third and fourth layers
$\rho$=specific resistance ($\Omega \cdot cm$) of the second layer.

2. The GTO thyristor according to claim 1, wherein said fourth layer is of a mesa type.

3. The GTO thyristor according to claim 1, wherein said fourth layer is of a planar type.

4. The GTO thyristor according to claim 1, wherein said fourth layer is of a multi-emitter type.

5. The GTO thyristor according to claim 1, wherein said second layer comprises a first region lying contiguous to said first layer and having a high impurity concentration; and
a second region lying contiguous to said third region and having a specific resistance $\rho$ at the normal temperature.

6. The GTO thyristor according to claim 1, wherein said second layer comprises a first region of high impurity concentration lying contiguous to said first layer and including a surface contacting the anode electrode;

a second region lying contiguous to said third regions and having a specific resistance $\rho$ at the normal temperature; and said fourth layer has a surface contacting the cathode electrode.

7. The GTO thyristor according to claim 1, wherein said first layer is provided with a region of said second conductivity type whose surface contacts said anode electrode; and said third layer whose surface contacts said cathode electrode has a region of said second conductivity type contacting said gate electrode.

8. The GTO thyristor according to claim 1, wherein said first diffused layer is of a P conductivity type and acts as an anode layer, said second layer is of an N conductivity type and acts as a first base layer, said third diffused layer is of a P conductivity type and acts as a second base layer, and said fourth diffused layer is of an N conductivity type and acts as a cathode layer.

* * * * *